United States Patent [19]

Sampei

[11] 4,168,471

[45] Sep. 18, 1979

[54] SOURCE FOLLOWER CIRCUIT USING FETS

[75] Inventor: Tohru Sampei, Yokohama, Japan

[73] Assignee: Hitachi, Ltd., Japan

[21] Appl. No.: 895,986

[22] Filed: Apr. 13, 1978

[30] Foreign Application Priority Data

Apr. 15, 1977 [JP] Japan .................................. 52/42677

[51] Int. Cl.$^2$ ............................................. H03F 3/185
[52] U.S. Cl. .................... 330/264; 330/277; 330/300
[58] Field of Search ............... 330/264, 269, 277, 300, 330/295

[56] References Cited

U.S. PATENT DOCUMENTS

| | | | |
|---|---|---|---|
| 3,678,402 | 7/1972 | Tempel | 330/277 X |
| 3,921,089 | 11/1975 | Tsurushima | 330/264 |
| 4,057,764 | 11/1977 | Yokoyama | 330/264 |

OTHER PUBLICATIONS

Chessman, "Prevent Emitter-Follower Oscillation", *Electronic Design* 13, Jun. 21, 1976, pp. 110–113.
Lynch, "MOSFET Amplifier Provides Almost Infinite Impedances", *Electronics*, Jul. 24, 1967, p. 88.

*Primary Examiner*—James B. Mullins
*Attorney, Agent, or Firm*—Craig and Antonelli

[57] ABSTRACT

A source follower circuit using at least one FET in which an end of a resistor element is connected to the gate terminal of the FET and the other end of the resistor element is connected to a signal source which generates a comparatively large AC input signal. The resistance of the resistor element is determined to be at such a value as to prevent oscillation of the FET which is likely to occur depending on the length of the wiring between the signal source and gate terminal and the length of wiring between the source terminal and a load.

9 Claims, 9 Drawing Figures

SOURCE FOLLOWER CIRCUIT USING FETS

BACKGROUND OF THE INVENTION

The present invention relates to a source follower circuit using at least one field effect transistor (hereinafter referred to as an FET), or more in particular to a source follower circuit using at least one power MOSFET (Metal Oxide Semiconductor FET).

As compared with a bipolar transistor, a MOSFET is high in the gain and is therefore effective in simplifying the circuit configuration. The many advantages of MOSFET also include superior frequency characteristics and fast switching operation, and hence less distortion. The source follower circuit, on the other hand, has especially superior frequency characteristics.

Conventional source follower circuits using MOSFETs, however, are used to amplify small signals to generate only a comparatively small AC signal and are used for amplification of, say, the front end of an FM tuner.

The input signal source for these circuits supplies an AC signal of at most several volts, in which the capacitance between drain and source of a used MOSFET is not more than several pF, so that the MOSFET is not subjected to an undesirable oscillation. In the power MOSFET, however, the input signal source thereof supplies an AC signal of several tens of volts so that the capacitance between the drain and source of a used MOSFET is as large as several hundreds pF, which often causes the MOSFET to oscillate.

The power MOSFET is provided with a radiation fin for radiating heat, with the result that the wiring connecting the gate terminal for signal input and the printed circuit board is considerably long. Further, the wiring between the drain and the speaker making up a load is undesirably long. These wiring conditions often cause the oscillation of the power MOSFET.

An object of the present invention is to eliminate or suppress the above-mentioned disadvantages of the prior art and to provide a stabilized source follower circuit using at least one FET free from oscillation. More particularly, it is an object of the present invention to provide an FET source follower circuit which may be used stably in the power stage without any oscillation.

To achieve this object, according to the present invention, a resistor is inserted between the gate terminal of an FET with a signal source, and the resistance of the resistor being determined to be at such value as to prevent oscillation of the FET.

According to one aspect of the present invention, there is provided a source follower circuit using at least one FET having a gate terminal, a drain terminal and a source terminal. The source follower circuit comprises a load resistor with one end thereof connected to the source terminal, a power supply connected for applying a predetermined voltage between the other end of the load resistor and the drain terminal, a signal source with one end thereof connected to the other end of the load resistor, and a resistor connected in series between the signal source and the gate terminal.

BRIEF DESCRIPTION OF THE DRAWING

Referring now to the drawing

DETAILED DESCRIPTION

Figure 1:
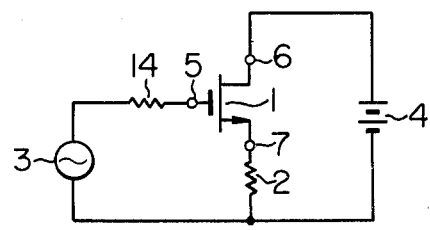
FIG. 1 is a circuit diagram showing an embodiment of a source follower circuit according to the present invention.

A circuit diagram of one embodiment of the present invention is shown in FIG. 1. In this drawing, reference numeral 1 shows an N-channel power MOSFET having a gate terminal 5, a drain terminal 6 and a source terminal 7. Numeral 2 shows a load, one end of which is connected to the source terminal 7. Numeral 4 shows a power supply inserted between the other end of the load 7 and the drain terminal 6, with the positive side thereof connected to the drain terminal 6. Numeral 3 shows a signal source with one end thereof connected to the negative electrode of the power supply 4. Numeral 14 shows a resistor connected in series between the other end of the signal source 3 and the gate terminal 5. In this configuration, the resistance of the resistor 14 is selected to be at such a value as to prevent oscillation of the power MOSFET 1.

Now, the conditions for oscillation will be explained below with reference to the drawings.

Figure 2:
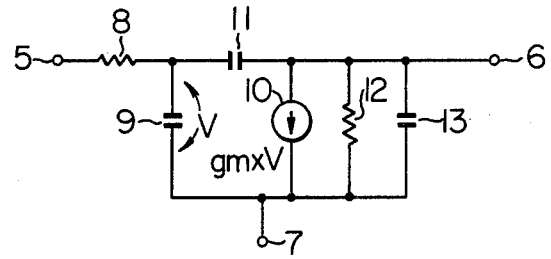
FIG. 2 is a diagram showing an equivalent circuit of a MOSFET with its source grounded.

A circuit substantially equivalent to MOSFET 1 is shown in FIG. 2.

Figure 3:
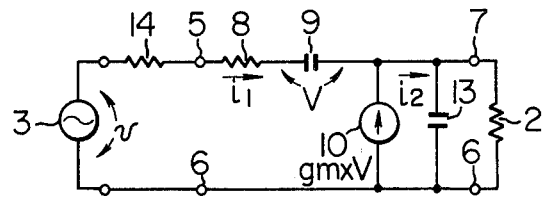
FIG. 3 is a diagram showing a simplified equivalent circuit of a source follower circuit.

In FIG. 2, numeral 5 shows a gate terminal, numeral 6 a drain terminal, numeral 7 a source terminal, numeral 8 a gate resistor having a resistance $r_x$, numeral 9 an input capacitor having a capacitance $c_{iss}$, numeral 10 a subsidiary current source in which a current equal to $g_m$ times the voltage V across the input capacitor 9 supplies, numeral 12 an output resistor having a resistance $r_O$, and numeral 13 an output capacitor having a capacitance $C_{oss}$. A circuit equivalent to the source follower circuit of FIG. 1 is shown in FIG. 3, in which, in order to change from the grounded-source configuration of FIG. 2 to the grounded-drain configuration, the drain terminal 6 is interchanged with the source terminal 7, the output resistance $r_O$ sufficiently large as compared with the load resistance $R_L$ is omitted, and also the small feed-back capacitance $C_{rss}$ is neglected.

In the circuit of FIG. 1, $$i_2 = i_1 + v \times g_m = i_1 + i_1 \times \frac{1}{j\omega C_{iss}} \times g_m \quad (1)$$

$$v = i_1\left(R_{14} + r_x + \frac{1}{j\omega C_{iss}}\right) + i_2\left(\frac{R_L}{1 + j\omega C_{oss} R_L}\right) \quad (2)$$

where v is the voltage across the signal source 3, $R_{14}$ is the resistance value of the resistor 14, $i_1$ the current flowing out of the signal source 3, and $i_2$ the current flowing in the output capacitor $C_{oss}$ and the load resistor $R_L$.

Substituting the equation (1) in equation (2), $$v = i_1\left(R_{14} + r_x + \frac{1}{j\omega C_{iss}}\right) + \\ i_1\left(1 + \frac{g_m}{j\omega C_{iss}}\right)\left(\frac{R_L}{1 + j\omega C_{oss} R_L}\right) \quad (3)$$

Therefore, the input impedance Zin as viewed from the signal source is $$Z_{in} = \frac{v}{i_1} = R_{14} + r_x + \frac{1}{j\omega C_{iss}} + \frac{R_L}{1 + \omega^2 C_{oss}^2 R_L^2} \\ - \frac{j\omega C_{oss} R_L^2}{1 + \omega^2 C_{oss}^2 R_L^2} - \frac{jg_m R_L}{\omega C_{iss}(1 + \omega^2 C_{oss}^2 R_L^2)} \\ - \frac{g_m C_{oss} R_L^2}{C_{iss}(1 + \omega^2 C_{oss}^2 R_L^2)} \quad (4)$$

Thus, the real part of the impedance is expressed as $$R_{14} + r_x + \frac{R_L}{1 + \omega^2 C_{oss}^2 R_L^2} - \frac{g_m C_{oss} R_L^2}{C_{iss}(1 + \omega^2 C_{oss}^2 R_L^2)}$$

which includes the negative real part. As a result, the condition for generating a negative resistance is expressed by the inequality (5) below.

$$R_{14} + r_x + \frac{R_L}{1 + \omega^2 C_{oss}^2 R_L^2} - \frac{g_m C_{oss} R_L^2}{C_{iss}(1 + \omega^2 C_{oss}^2 R_L^2)} < 0 \quad (5)$$

Generally, $1 >> \omega^2 C_{oss}^2 R_L^2$, and therefore, inequality (5) is rewritten as shown in inequality (6) below.

$$R_{14} + r_x + R_L - \frac{g_m C_{oss} R_L^2}{C_{iss}} < 0 \quad (6)$$

This power MOSFET is produced by Hitachi, Ltd. and available in a number of types including 2SK132, 2SK133, 2SK134 and 2SK135 of P-channel type, and 2SJ47, 2SJ48, 2SJ49 and 2SJ50 of N-channel type. The constants of these MOSFETs are $r_x = 0.5\Omega$, $C_{iss} = 500$ pF, $g_m = 1S$, and $C_{oss} = 200$ pF. The load resistor $R_L$ has a resistance equal to the impedance resistance of a speaker, i.e., $8\phi$. Substituting these values in inequality (6), inequality (7) below is obtained.

$$R_{14} - 25 < 0 \quad (7)$$

This means that the real part of the input impedance in the conventional circuits lacking the resistor 14 is $-25\Omega$, i.e., a negative resistance. In conventional circuits where the output impedance of the signal source is not more than $25\Omega$, therefore, the input impedance as viewed from the signal source is negative, which results in the possibility of an oscillation, which occurs due to the inductance of the wiring between the gate terminal and the signal source.

Now let it be assumed that such an inductance be L. Since the oscillation frequency is equal to the value rendering the imaginary part in equation (4) zero, the oscillation frequency is given as $$f = \frac{1}{2\pi}\sqrt{\frac{1 + g_m R_L}{L \cdot C_{iss}}} \quad (8)$$

When the inductance is small, the oscillation frequency is high. In view of the fact that, as shown in the inequality (5), the negative resistance value is decreased with the increase in frequency, however, no oscillation occurs when the impedance is very small.

It was already explained that the power MOSFET is mounted on a radiating fin in order to radiate heat, so that the wiring connecting the gate terminal and the printed circuit board is often long. If the wiring is as long as 20 cm, for instance, the inductance is approximately 60 mH. As a consequence, the power MOSFET with the constants described above, for example, oscillates at 80 MHz.

In order to prevent this oscillation, the impedance of the signal source is required to be high, as explained above. From inequality (6), such a condition is satisfied when $$R_{14} + r_x + R_L - \frac{g_m C_{oss} R_L^2}{C_{iss}} > 0 \quad (9)$$

In the cases where the constants shown above are involved, the requirement is that $$R_{14} - 25 > 0$$

That is to say, $R_{14}$ is required to be more than $25\Omega$.

The present invention is based on this principle and such that the resistor 14 having the resistance value ($R_{14}$) of more than $25\Omega$ is inserted in series between the gate terminal and the signal source. This positive resistor offsets the negative resistance and thus prevents the oscillation. In practical applications, the wiring between the source terminal and the load or speaker is unavoidably lengthened, and in order to prevent oscillation by such lengthened wiring, the resistance value $R_{14}$ of the resistor 14 should be selected properly so as to be not less than $100\Omega$.

Figure 4:
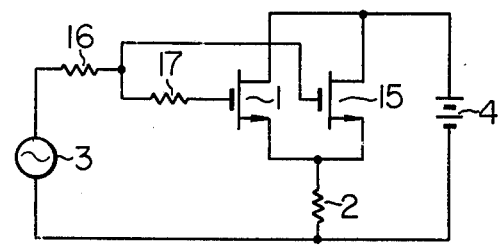
FIG. 4 is a circuit diagram showing an embodiment of a source follower circuit in which FETs are connected in parallel according to the present invention.

An embodiment of the source follower circuit having parallelly-connected FETs according to the present invention is shown in FIG. 4. In this figure, like reference numerals denote like component elements in FIG. 1. Numeral 15 shows an N-channel power MOSFET similar to the FET 1, and numerals 16 and 17 resistors. The source terminal of the MOSFET 15 is connected to the source terminal of the MOSFET 1, while the drain terminal of MOSFET 15 is connected to the drain terminal of the MOSFET 1. The resistor 14 inserted between the gate terminal of MOSFET 1 and the signal source in FIG. 1 is replaced by two resistors 16 and 17 in FIG. 4. A junction point of the resistors 16 and 17 is connected to the gate terminal of the MOSFET 15 by a wiring. As shown in FIG. 4, at least one resistor such as resistor 17 is required to be connected between the gate terminals of the power MOSFETs 1 and 15. Unless the resistor 17 is connected to one of the gate terminals, the oscillation occurs even in the presence of resistor 16 between the gates and the signal source. This is for the reason that the impedance of the signal source to the MOSFET 15 is equal to the impedance of a parallel connection of the resistance of the resistor 16 and the input impedance of the MOSFET 1. Even if the resistor 16 has a large resistance value, therefore, the real part of the input impedance of the MOSFET 1 is small, with the result that, as viewed from the MOSFET 15, the impedance of the signal source is very low and fails to offset the negative resistance, thereby leading to the oscillation. The same applies to the impedance of the signal source as viewed from the MOSFET 1. As will be seen from the foregoing description, in a source follower circuit having MOSFETs connected in parallel, direct connection of the gate terminals tends to cause oscillation, thus rendering the circuit unstable. In order to obviate this problem, a resistor of not less than 100Ω is connected to the gate terminal of at least one of the power MOSFETs, so that the negative resistance is offset, thereby preventing the oscillation. In actual cases, resistors of several hundred ohms are used as the resistors 16 and 17. The junction point of the resistors 16 and 17 of course may be connected through another resistor to the gate terminal of the power MOSFET 15.

Figure 5:
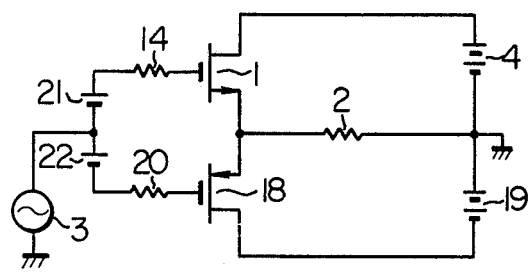
FIG. 5 is a circuit diagram showing an embodiment of a source follower circuit in which FETs are connected in push-pull fashion according to the invention.

The diagram of FIG. 5 shows an embodiment of the source follower circuit with FETs connected in push-pull fashion according to the present invention. In FIG. 5, similar reference numerals show similar circuit elements in FIG. 1. Numeral 18 shows a P-channel power MOSFET, numeral 19 a power supply, numeral 20 a resistor, and numerals 21 and 22 bias power supplies. The source terminal of MOSFET 18 is connected to the source terminal of MOSFET 1; the drain terminal of MOSFET 18 is connected to the negative electrode of the power supply 19; and the positive electrode of the power supply 19 is connected to a terminal of the load resistor 2. MOSFET 18 has a gate terminal thereof connected to one end of the resistor 20, the other end of the resistor 20 being connected through the bias power supply 22 to the signal source 3. The bias power supply 21 is inserted between the signal source 3 and the resistor 14. The circuit of FIG. 5 includes MOSFET 1 of N channel and the MOSFET 18 of P channel connected in complementary fashion, thus constituting a source follower circuit and a push-pull circuit at the same time. As explained with reference to the circuit of FIG. 1 and the source follower circuit of FIG. 4 having parallel-connected FETs, oscillation occurs if the impedance on the signal source side as viewed from the MOSFET 1 or 18 is small. The circuit of FIG. 5 has resistors 14 and 20 of 100Ω or more connected to the gate terminals of the power MOSFETs 1 and 18, so that the negative resistance is offset and oscillation is prevented.

Figure 6:
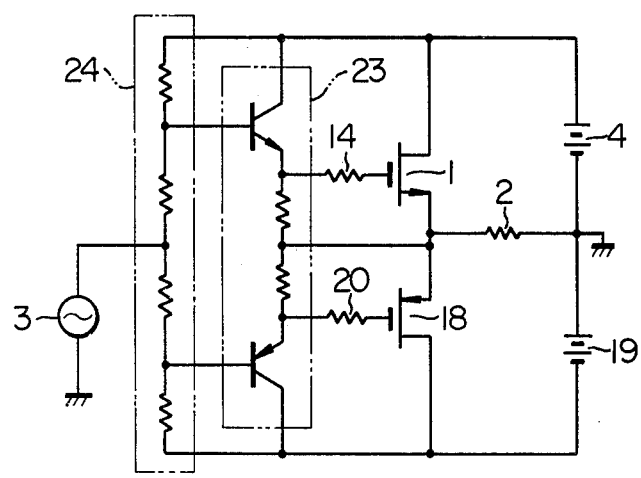
FIG. 6 is a circuit diagram showing another embodiment of a source follower circuit in which FETs are connected in push-pull fashion according to the invention.

A source follower circuit having the FETs connected in push-pull fashion as in FIG. 5 is shown in FIG. 6. In FIG. 6, like component elements are denoted by like reference numerals in FIG. 5. Numeral 23 shows an emitter-follower transistor circuit section for driving the power MOSFETs 1 and 18, and numeral 24 a bias resistor network. In the circuit of FIG. 6, the MOSFETs 1 and 18 are driven by the emitter follower section and therefore the signal source has a very low impedance. In the absence of resistors 14 and 20, therefore, oscillation tends to occur. By inserting the resistors 14 and 20, the negative resistance is offset and thus oscillation is prevented.

Figure 7:
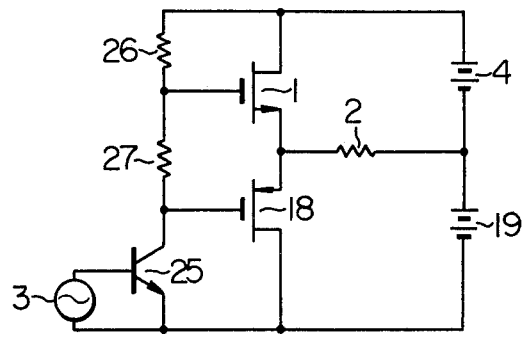
FIG. 7 is a circuit diagram showing still another embodiment of a source follower circuit in which FETs are connected in push-pull fashion according to the present invention.

The diagram of FIG. 7 shows an embodiment in which the resistors for offsetting the negative resistance also serve as bias resistors in a push-pull circuit of source-follower type.

In FIG. 7, like reference numerals designate like component parts as in FIG. 5. Numeral 25 shows a voltage-amplification transistor, numeral 26 a load resistor for the transistor 25, and numeral 27 a bias resistor. The source terminals of the power MOSFETs 1 and 18 are connected to each other, and the drain terminals thereof are connected across the power supplies 4 and 19 with the positive electrodes thereof connected to MOSFET 1. A load resistor 2 is inserted between a junction point of the source terminals and a junction point of the power supplies 4 and 19. Further, the resistor 26 is inserted between the positive electrode of the power supply 4 and the gate terminal of MOSFET 1. The resistor 27 is inserted between the gate terminals of MOSFETs 1 and 18. The collector terminal of the transistor 25 is connected to the gate terminal of the MOSFET 18, while the emitter terminal thereof is connected to the negative electrode of the power supply 19. A signal source 3 is inserted between the base and emitter terminals of the transistor 25.

The circuit of FIG. 7 is such that the MOSFETs 1 and 18 are biased by the voltage drop across the resistor 27 and thus current is caused to flow in the absence of a signal, the resistor 27 connecting the gate terminals of the MOSFETs 1 and 18 to each other. As explained with reference to the embodiment of FIG. 5, the source follower circuit with FETs connected in push-pull fashion tends to oscillate unless a resistor is inserted between the gate terminals and the signal source. Oscillation often occurs also when the gate terminals of MOSFETs are connected directly to each other. In the circuit of FIG. 7, unlike the circuit of FIG. 6, the output impedance of the collector of the transistor 25 and the resistor 26 are presented as viewed from the gate terminals of the MOSFETs 1 and 18 toward the signal source. Because of the high impedance on the signal source side and the presence of the resistor 27 inserted between the gate terminals of the MOSFETs 1 and 18, the resistance value of the resistor 27 is added as the impedance as viewed from the gate terminal of the MOSFEt 1 toward the gate terminal of the MOSFET 18. The same holds true for the impedance as viewed from the MOSFET 18 side. Thus, the negative resistance included in the impedance of each of the MOSFETs is offset, thereby preventing oscillation. Incidentally, the resistor 26 may be replaced by a transistor with equal effect.

Figure 8:
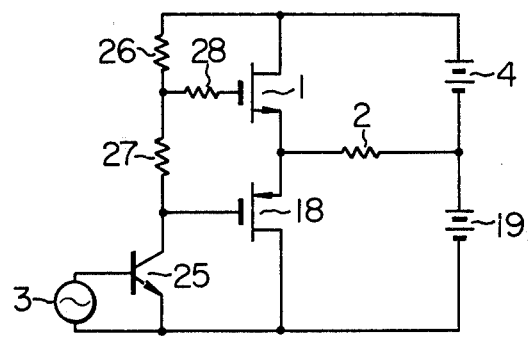
FIG. 8 is a circuit diagram showing a further embodiment similar to the circuit of FIG. 7.

Still another embodiment similar to the circuit of FIG. 7 is shown in FIG. 8, in which like reference numerals denote like component elements in FIG. 7. Numeral 28 shows a resistor. In FIG. 8, the resistor 28 is inserted between a junction point of the resistors 26 and 27 and the gate terminal of the power MOSFET 1. The resistor 27, being a bias resistor, has its own limit in value. This limitation is compensated for by the resistor 28. This resistor 28 may alternatively be connected between the collector of transistor 25 and the gate terminal of the MOSFET 18, or between a junction point of the resistor 27 and the gate terminal of MOSFET 18 and the collector terminal of transistor 25.

Figure 9:
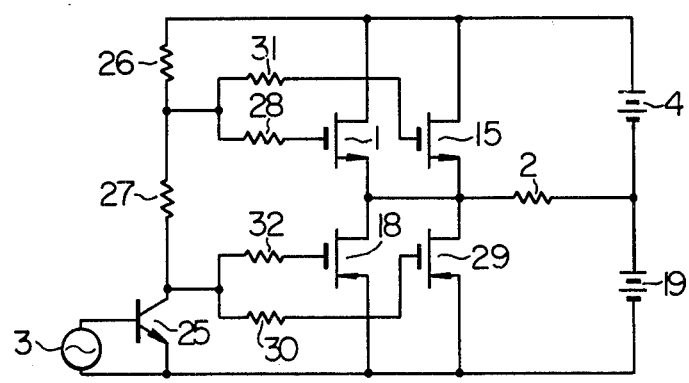
FIG. 9 is a circuit diagram showing a still further embodiment of the present invention in which FETs are connected in parallel and in push-pull fashion.

The diagram of FIG. 9 shows a still further embodiment of the invention in which the MOSFETs connected in parallel as shown in FIG. 4 are further connected in push-pull fashion as in FIG. 8. In FIG. 9, like numerals show like component elements as in FIGS. 4 and 8, and power MOSFETs 18 and 29 are connected in parallel. The gate terminals of the power MOSFETs 1, 15, 18 and 29 are connected with resistors 28, 31, 32 and 30 respectively. As already explained, one of the resistors 28 and 31 and/or one of the resistors 32 and 30 may be omitted. In practical circuits, the power MOSFETs 1 and 15 may consist of Types 2SK135 of Hitachi, Ltd. and the power MOSFETs 18 and 29 Type 2SJ50 of the same company. Each of the resistors 31, 28, 32 and 30 has a resistance value of 220Ω; the load resistor 2 has a resistance value of 8Ω; and each of the power supplies 4 and 19 has a voltage of 60 V. In this way, a power MOSFET circuit of 100 W is completed.

What is claimed is:

1. A source follower circuit using at least two FETs each having a gate terminal, a drain terminal and a source terminal, said source follower circuit comprising a load resistor with one end thereof connected to said each source terminal, a power supply connected for applying a predetermined voltage between the other end of said load resistor and said each drain terminal, a signal source with one end thereof connected to the other end of said load resistor, at least two resistors connected in series between the other end of said signal source and the gate terminal of one of said FETs, and a series connection between a junction point of said at least two resistors and the gate terminal of the other of said FETs.

2. A source follower circuit according to claim 1, in which all of said at least two FETs are power MOSFETs.

3. A source follower circuit according to claim 2, wherein the input resistance of said power MOSFETs is negative, and the values of said at least two resistors are set to compensate for this negative input resistance so that the input resistance of the source follower circuit viewed from the signal source is positive.

4. A source follower circuit comprising:
at least two power MOSFETs including an N-channel and a P-channel MOSFET, each having a gate terminal, a drain terminal and a source terminal;
a load resistor with one end thereof connected to said source terminals;
a first power supply connected for applying a predetermined voltage between the other end of said load resistor and the drain terminal of one of said MOSFETs;
a second power supply connected for applying a predetermined voltage between the other end of said load resistor and the drain terminal of the other of said MOSFETs;
a first resistor component with one end thereof connected to the drain terminal of said one of said MOSFETs;
a resistor with one end thereof connected to the other end of said first resistor component;
a transistor with a collector terminal thereof connected to the other end of said resistor, said transistor having an emitter terminal thereof connected to the drain terminal of said other of said MOSFETs;
a first D.C. connection between a junction point of said first resistor component and said resistor and the gate terminal of said one of said MOSFETs;
a second D.C. connection between a junction point of said resistor and the collector of said transistor and the gate terminal of said other of said MOSFETs; and
a signal source connected to the base terminal and the emitter terminal of said transistor,
wherein the input resistance of the power MOSFETs is negative, and the values of the first resistor component and the resistor are set to compensate for this negative input resistance so that the input resistance of the source follower circuit viewed from the signal source is positive.

5. A source follower circuit according to claim 4, in which said first D.C. connection includes a second resistor.

6. A source follower circuit according to claim 4, in which said second D.C. connection includes a third resistor.

7. A source follower circuit according to claim 6, further comprising:
a first series circuit comprising a fourth resistor and a MOSFET coupled between the junction point of the first D.C. connection and the load resistor; and
a second series circuit comprising a fifth resistor and a MOSFET coupled between the junction of the second D.C. connection and the load resistor.

8. A source follower circuit comprising:
at least two power MOSFETs including an N-channel MOSFET and a P-channel MOSFET, each having a gate terminal, a drain terminal and a source terminal;
a load resistor with one end thereof connected to both of said source terminals;
a first power supply connected for applying a predetermined voltage between the other end of said load resistor and the drain terminal of one of said MOSFETs;
a second power supply connected for applying a predetermined voltage between the other end of said load resistor and the drain terminal of the other of said MOSFETs;
a signal source with one end thereof connected to the other end of said load resistor;
a first resistor with one end thereof connected to the gate terminal of said one of said MOSFETs;
a first bias power supply connected between the other end of said first resistor and the other end of said signal source;
a second resistor with one end thereof connected to the gate terminal of said other of said MOSFETs; and
a second bias power supply connected between the other end of said second resistor and the other end of said signal source,
wherein the input resistance of the power MOSFETs is negative, and the values of the first and second resistors are set to compensate for this negative input resistance so that the input resistance of the source follower circuit viewed from the signal source is positive.

9. A source follower circuit comprising:
at least two power MOSFETs including an N-channel MOSFET and a P-channel MOSFET, each having a gate terminal, a drain terminal and a source terminal;
a load resistor with one end thereof connected to both of said source terminals;
a first power supply connected for applying a predetermined voltage between the other end of said load resistor and the drain terminal of one of said MOSFETs;

a second power supply connected for applying a predetermined voltage between the other end of said load resistor and the drain terminal of the other of said MOSFETs;

a signal source with one end thereof connected to the other end of said load resistor;

a first resistor with one end thereof connected to the gate terminal of said one of said MOSFETs;

a second resistor with one end thereof connected to the gate terminal of said other of said MOSFETs;

a transistor driving network having outputs coupled to the other ends of said first and second resistors; and a bias network coupled between inputs of the transistor driving network and the signal source, wherein the input resistance of the power MOSFETs is negative, and the values of the first and second resistors are set to compensate for this negative input resistance so that the input resistance of the source follower circuit viewed from the signal source is positive.

* * * * *